United States Patent
Zhang et al.

(10) Patent No.: US 12,532,430 B2
(45) Date of Patent: Jan. 20, 2026

(54) HEAT DISSIPATION DEVICE AND DISPLAY EQUIPMENT HAVING THE SAME

(71) Applicants: Fu Tai Hua Industry (Shenzhen) Co., Ltd., Shenzhen (CN); HON HAI PRECISION INDUSTRY CO., LTD., New Taipei (TW)

(72) Inventors: Xiao-Xiao Zhang, Shenzhen (CN); Zhen Yin, Shenzhen (CN); Yu-Hsiu Chien, New Taipei (TW); Cheng Ni, Shenzhen (CN); Pan Zhang, Shenzhen (CN); Zhuo Wang, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

(*) Notice: Subject to any disclaimer, the term of this patent is extended or adjusted under 35 U.S.C. 154(b) by 411 days.

(21) Appl. No.: 18/209,514

(22) Filed: Jun. 14, 2023

(65) Prior Publication Data
US 2023/0328915 A1  Oct. 12, 2023

(30) Foreign Application Priority Data
Jan. 31, 2023 (CN) .......................... 202310120455.6

(51) Int. Cl.
H05K 7/20 (2006.01)
(52) U.S. Cl.
CPC ..... *H05K 7/20127* (2013.01); *H05K 7/20954* (2013.01)
(58) Field of Classification Search
CPC ........... H05K 7/20127; H05K 7/20954; G02B 27/0149; G02B 27/0176; G06F 1/163
USPC ........................................................ 165/80.2
See application file for complete search history.

(56) References Cited

U.S. PATENT DOCUMENTS

| | | | | |
|---|---|---|---|---|
| 10,683,051 B2 * | 6/2020 | Tsou | ......................... | B62J 17/06 |
| 11,092,772 B2 * | 8/2021 | Zheng | ................ | G02B 27/0176 |
| 11,425,829 B2 * | 8/2022 | Zheng | .................... | G02B 7/023 |
| 11,966,062 B2 * | 4/2024 | Greenstein | ......... | G02B 27/0176 |
| 12,317,965 B2 * | 6/2025 | Chen | ....................... | G06F 1/163 |

FOREIGN PATENT DOCUMENTS

| | | | | |
|---|---|---|---|---|
| CN | 211786376 U | | 10/2020 | |
| CN | 112379522 A | | 2/2021 | |
| CN | 113448090 B | * | 3/2023 | ......... H05K 7/20972 |

(Continued)

*Primary Examiner* — Jon T. Schermerhorn, Jr.
(74) *Attorney, Agent, or Firm* — ScienBiziP, P.C.

(57) ABSTRACT

A heat dissipation device includes a housing assembly, a sliding assembly, and a linkage assembly. The housing assembly includes a receiving cavity and a cooling hole communicating with the receiving cavity. The sliding assembly includes a sliding member and a rack. The sliding member is located in the receiving cavity and slidably connected to a side of the housing assembly with the cooling hole, the rack is fixedly connected to the sliding member. The linkage assembly includes a rotating shaft and a gear. The rotating shaft and the gear are located on the same side of the sliding member, the rotating shaft is fixed on the housing assembly and extends through the gear, the gear is rotatably sleeved on the rotating shaft and is engaged with the rack to drive the sliding member to slide, thereby adjusting an area of the cooling hole blocked by the sliding member.

20 Claims, 10 Drawing Sheets

(56) References Cited

FOREIGN PATENT DOCUMENTS

| | | | | |
|---|---|---|---|---|
| CN | 119045201 B | * | 4/2025 | ......... H05K 7/20509 |
| CN | 120024643 A | * | 5/2025 | |
| CN | 120127890 A | * | 6/2025 | |
| CN | 120405965 A | * | 8/2025 | |
| KR | 102439993 B1 | * | 9/2022 | ......... H05K 7/20136 |
| WO | WO-2020019183 A1 | * | 1/2020 | ........... H01L 23/473 |

* cited by examiner

HEAT DISSIPATION DEVICE AND DISPLAY EQUIPMENT HAVING THE SAME

FIELD

The subject matter herein generally relates to a technical field of heat dissipation, in particular to a heat dissipation device and a display equipment having the heat dissipation device.

BACKGROUND

With the upgrading of virtual reality (VR) and augmented reality (AR) technologies, virtual reality and augmented reality are welcomed by more and more people for their rich experiences.

Display devices (such as VR glasses/AR glasses) capable of realizing virtual reality and augmented reality usually need to integrate electronic components into the housing. The housings in the prior art are closed structures or have dissipation ports with a fixed area, which has a poor heat dissipation effect, and the electronic components are likely to cause heat accumulation inside the housing during use, which affects performance.

BRIEF DESCRIPTION OF THE DRAWINGS

Implementations of the present disclosure will now be described, by way of embodiments, with reference to the attached figures.

DETAILED DESCRIPTION

Figure 1:
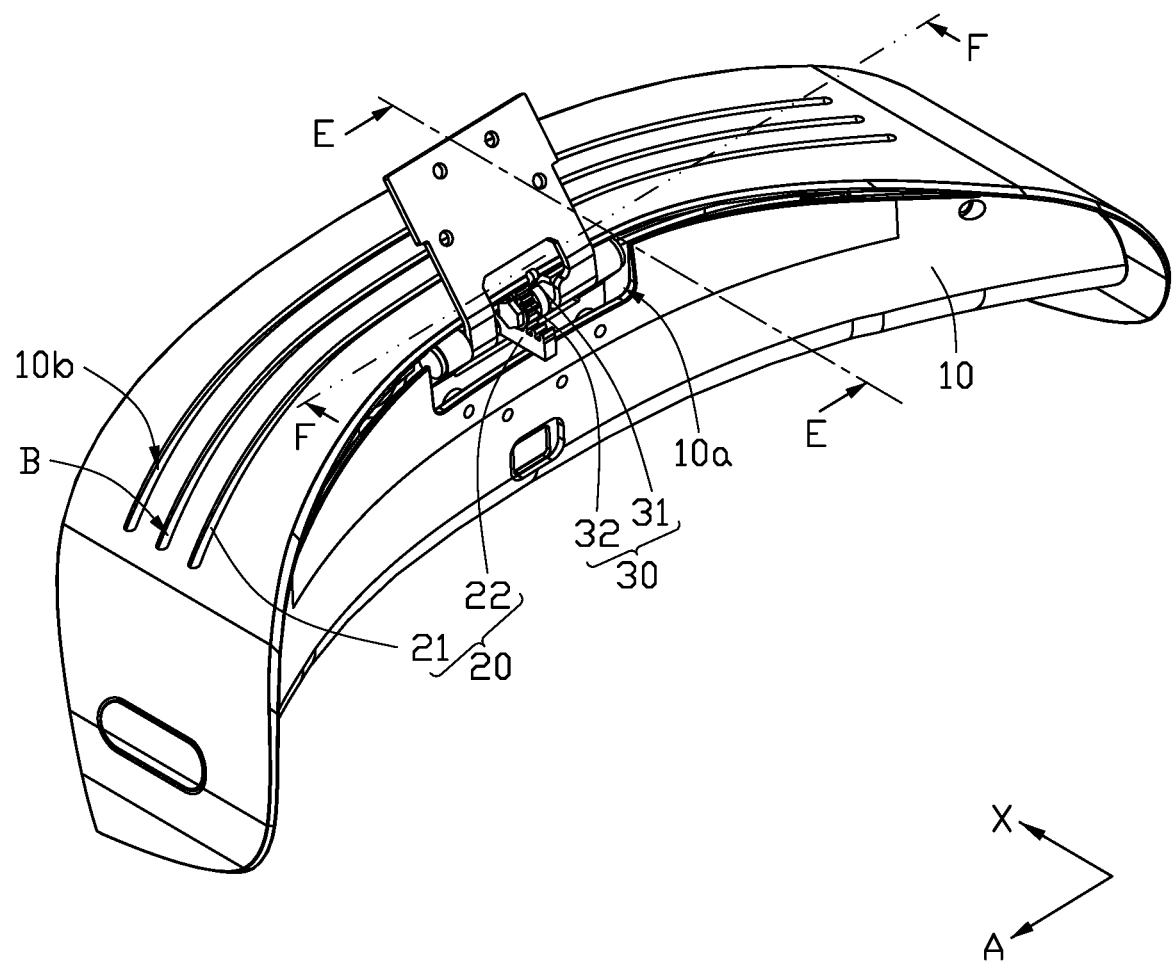
FIG. 1 is a diagram of an embodiment of a heat dissipation device at a first state that a sliding member of the heat dissipation device is located in a first position according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

FIG. 1 illustrates an embodiment of a heat dissipation device 100. Referring to FIG. 1, the heat dissipation device 100 includes a housing assembly 10, a sliding assembly 20, and a linkage assembly 30. A receiving cavity 10a and a cooling hole 10b communicating with the receiving cavity 10a are defined by the housing assembly 10. The receiving cavity 10a may be configured to receive at least one electronic element. The cooling hole 10b is configured to allow air convection between the receiving cavity 10a and an external environment to dissipate heat from the receiving cavity 10a.

Figure 2:
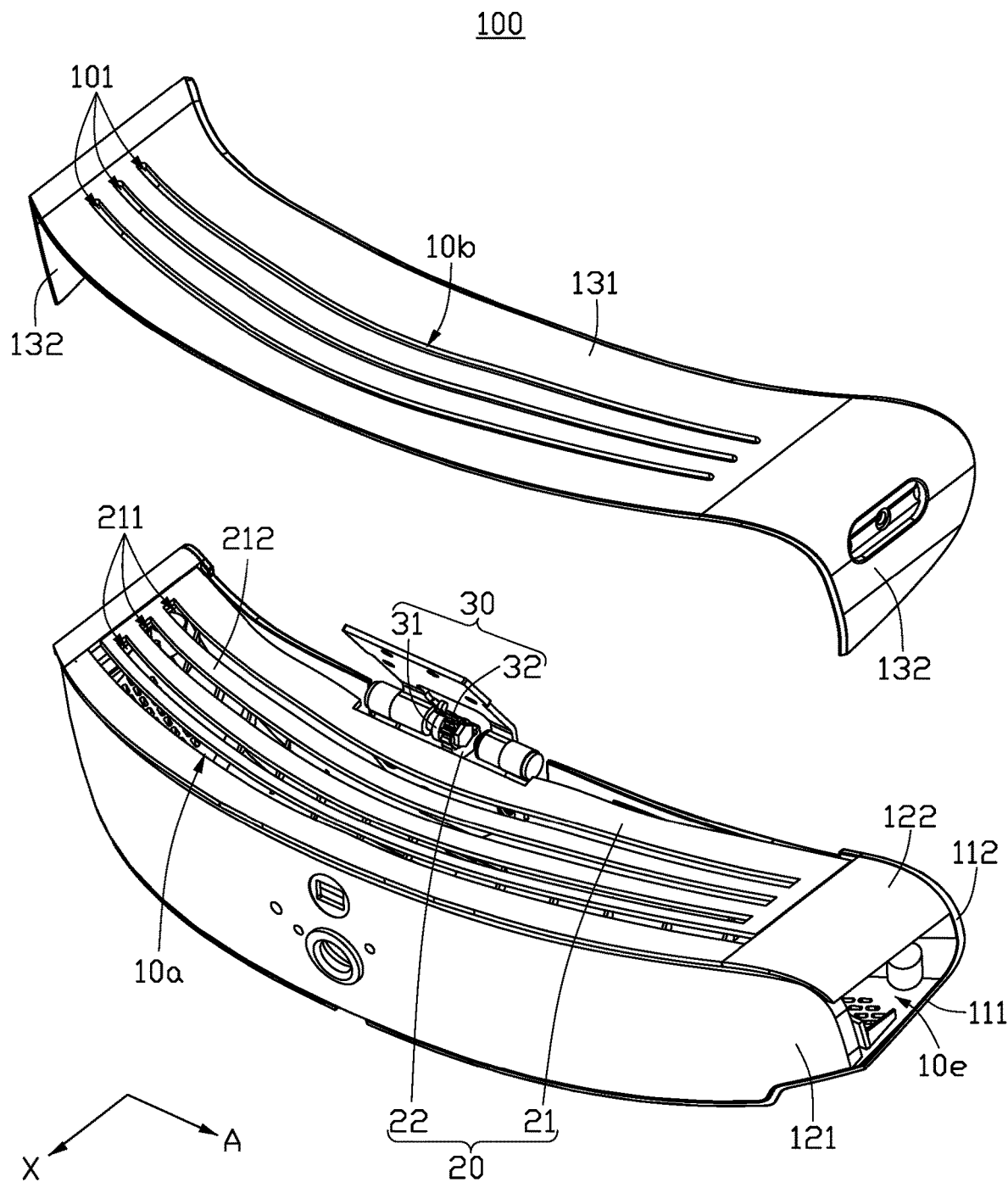
FIG. 2 is a partial exploded, diagrammatic view of an embodiment of a heat dissipation device according to the present disclosure.

Referring to FIG. 1 and FIG. 2, the sliding assembly 20 includes a sliding member 21 and a rack 22. The sliding member 21 is received in the receiving cavity 10a, and the sliding member 21 is slidably connected to a side of the housing assembly 10 with the cooling hole 10b. An area of the cooling hole 10b blocked by the sliding member 21 can be adjusted by sliding the sliding member 21 relative to the cooling hole 10b, so that an area of the cooling hole 10b communicating the external environment can be adjusted. The rack 22 is fixed to the sliding member 21, so that the rack 22 moves synchronously with the sliding member 21 when the sliding member 21 moves.

Figure 3:
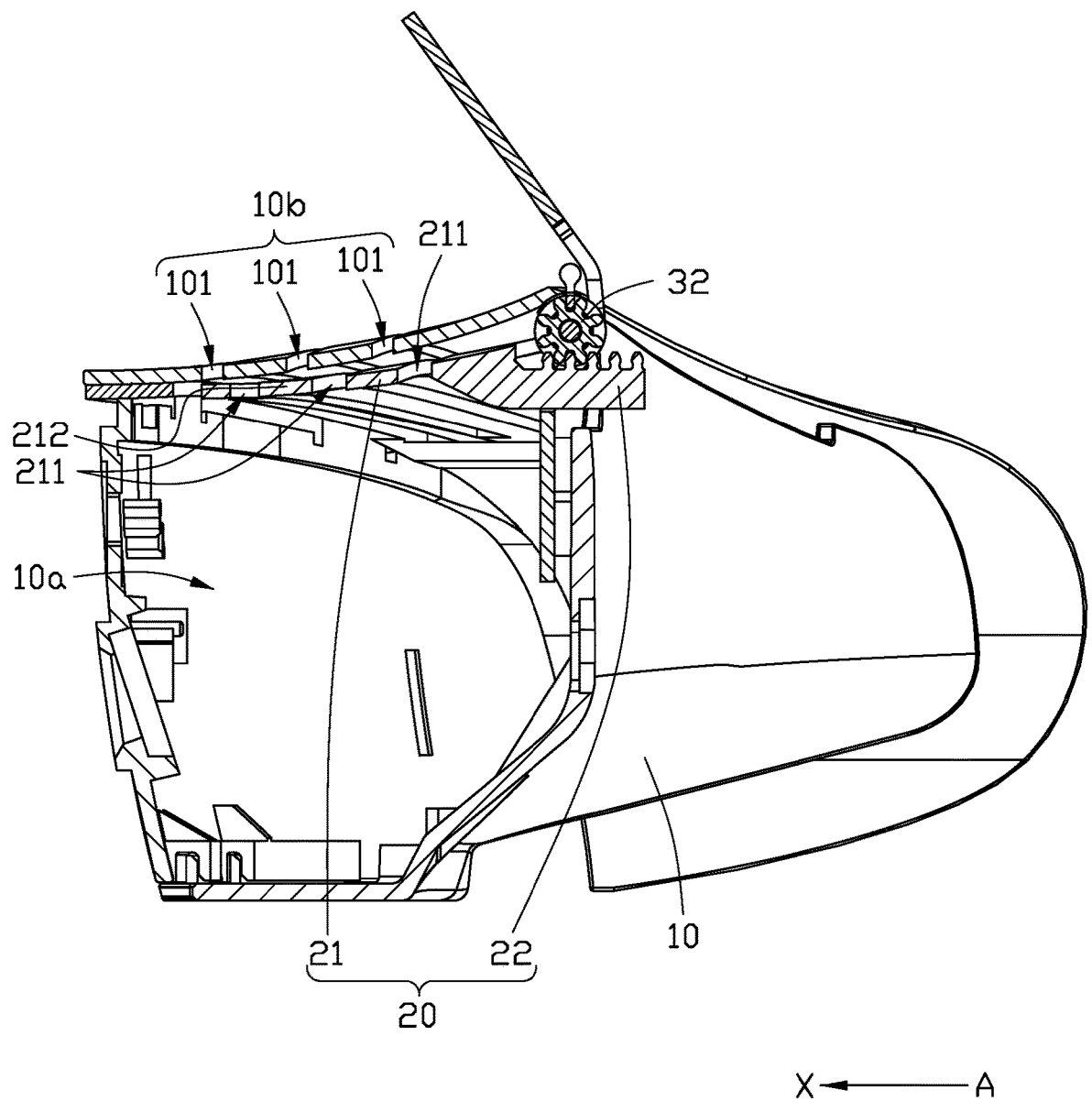
FIG. 3 is a cross-sectional view of the heat dissipation device along E-E line of FIG. 1.

Referring to FIG. 1, FIG. 2, and FIG. 3, the linkage assembly 30 includes a rotating shaft 31 and a gear 32. The rotating shaft 31 and the gear 32 are located on the same side of the sliding member 21. The rotating shaft 31 is fixed on the housing assembly 10 and extends through the gear 32. The gear 32 is rotatably sleeved on the rotating shaft 31 and is engaged with the rack 22. The gear 32 is configured to drive the sliding member 21 to slide relative to the cooling hole 10b through the rack 22, thereby adjusting the area of the cooling hole 10b blocked by the sliding member 21. Through the linkage of the gear 32 and the rack 22, the accuracy of sliding of the sliding member 21 relative to the cooling hole 10b can be improved, so that the area of the cooling hole 10b blocked by the sliding member 21 is easily to be adjusted accurately.

It can be understood that during use, the area of the cooling hole 10b blocked by the sliding member 21 is inversely correlated with a temperature inside the cooling hole 10b. Specifically, if the temperature inside the cooling hole 10b is higher, the area of the cooling hole 10b blocked by the sliding member 21 should be smaller in order to increase an area of the cooling hole 10b communicating with the external environment, thereby improving the heat dissipation efficiency. If the temperature inside the cooling hole 10b is lower, the area of the cooling hole 10b blocked by the sliding member 21 should be larger in order to decrease the area of the cooling hole 10b communicating with the external environment, thereby reducing a risk of impurities such as dust entering the cooling hole 10b.

In the above heat dissipation device 100, the sliding member 21 can slide relative to the cooling hole 10b to adjust the area of the cooling hole 10b blocked by the sliding member 21. The precision of the sliding member 21 sliding relative to the cooling hole 10b can be improved through the linkage of the gear 32 and the rack 22, so that the area of the cooling hole 10b blocked by the sliding member 21 can be adjusted accurately, and the heat dissipation efficiency can be improved because the area of the cooling hole 10b communicating with the external environment can be dynamically adjusted according to the temperature inside the cooling hole 10b.

Figure 4:
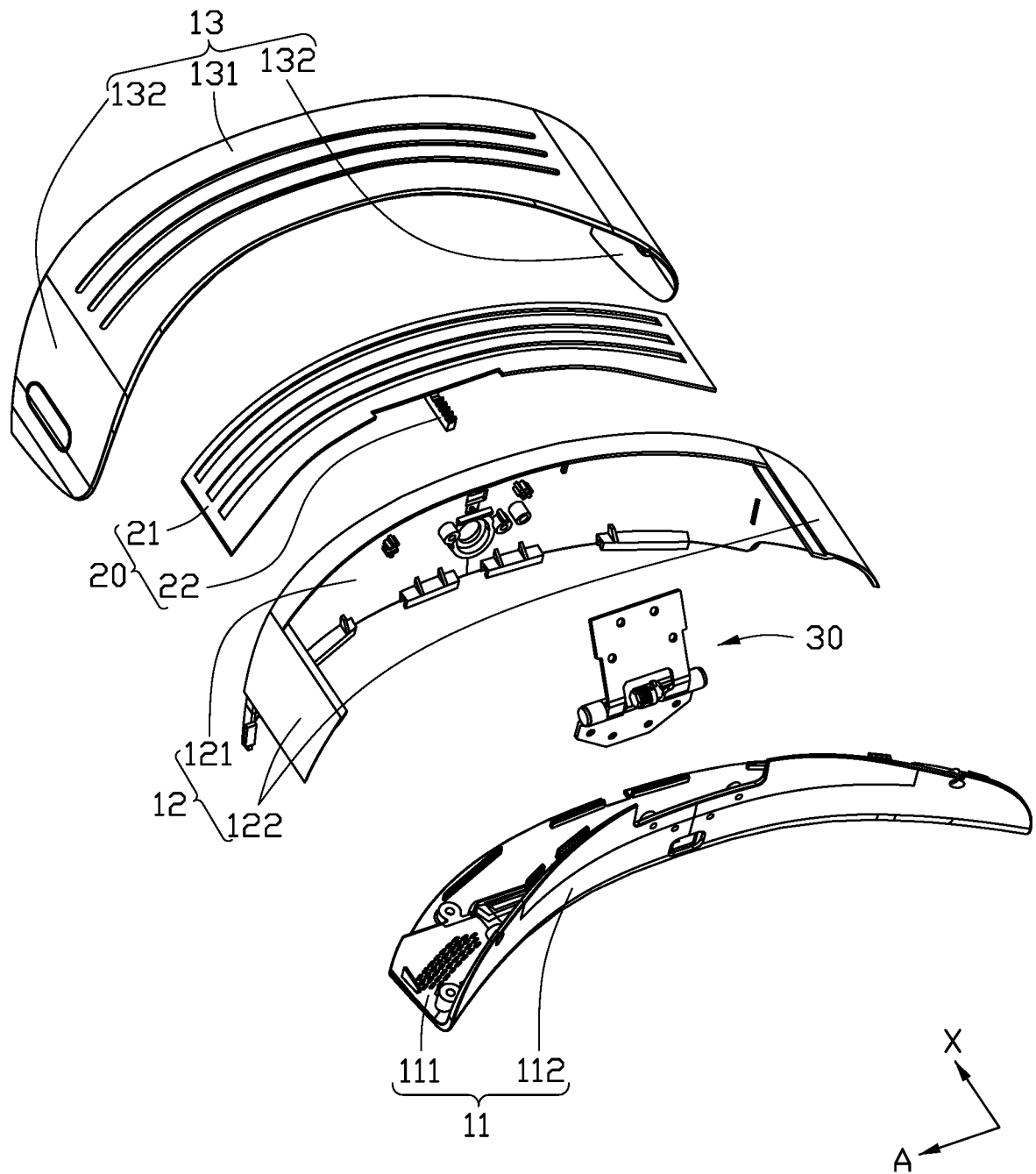
FIG. 4 is an exploded, diagrammatic view of an embodiment of a heat dissipation device according to the present disclosure.
Figure 5:
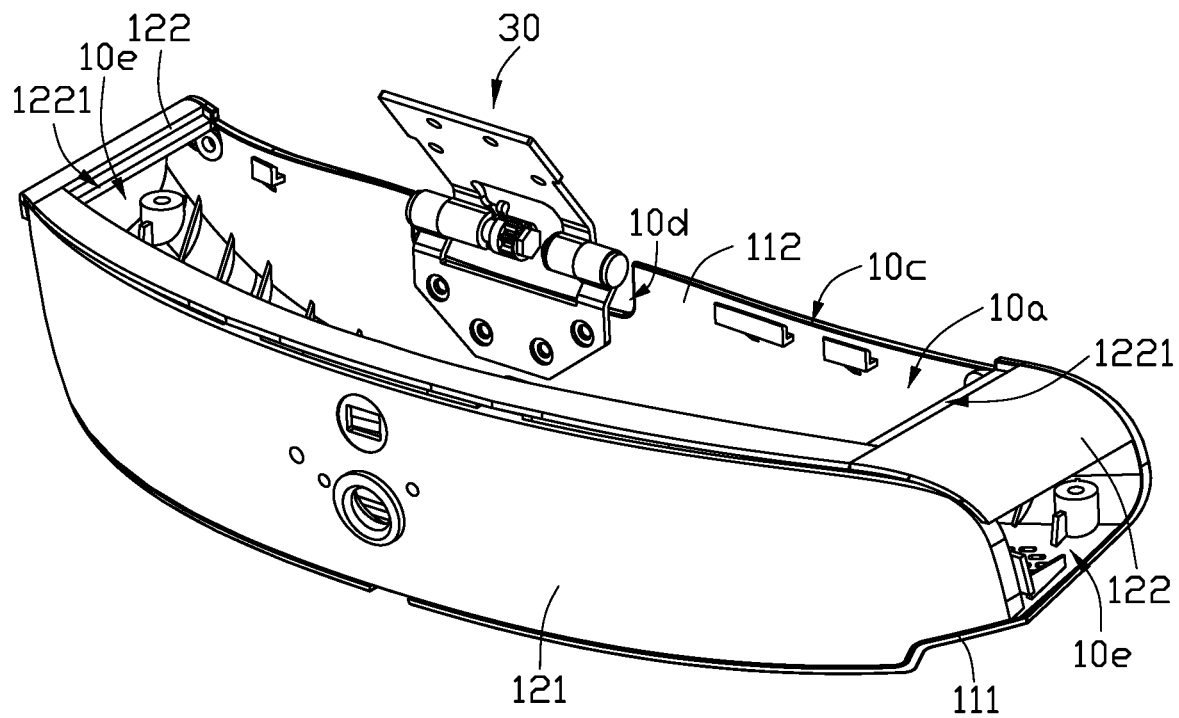
FIG. 5 is a partial diagram of an embodiment of a heat dissipation device according to the present disclosure.

Referring to FIGS. 4 and 5, in at least one embodiment, the housing assembly 10 may include a first housing 11, a second housing 12, and a cover 13. The first housing 11 and the second housing 12 are connected to each other to define the receiving cavity 10a and an opening 10c on one side of the receiving cavity 10a. The cover 13 is configured to cover the opening 10c. The cooling hole 10b is defined by the cover 13, and the cooling hole 10b is communicated with the receiving cavity 10a through the opening 10c. The sliding member 21 is slidably connected to a side of the cover 13 facing the receiving cavity 10a to facilitate sliding the sliding member 21 relative to the cooling hole 10b. Specifically, the sliding member 21 is slidably received in the opening 10c to improve the integration between the sliding member 21 and the housing assembly 10, so that the space utilization can be improved.

In at least one embodiment, the first housing 11 may include a bottom wall 111 and a rear wall 112 bent relative to the bottom wall 111, and the second housing 12 may include a front wall 121 and two connecting walls 122 connected to one side of the front wall 121. The rear wall 112 is connected to the bottom wall 111. The connecting walls 122 are arranged at intervals. A side of the bottom wall 111 facing away from the rear wall 112 is connected to a side of the front wall 121 facing away from the connecting walls 122, a side of the connecting walls 122 facing away from the front wall 121 is connected to a side of the rear wall 112 facing away from the bottom wall 111. The receiving cavity 10a is surrounded by the bottom wall 111, the rear wall 112, the connecting walls 122, and the front wall 121. The opening 10c is defined by the front wall 121, the connecting walls 122, and the rear wall 112.

Sides of the connecting walls 122 facing each other are respectively provided with recesses 1221, and opposite sides of the sliding member 21 are slidably connected in the recesses 1221 to improve the sliding stability of the sliding member 21.

An escape opening 10d is defined on the side of the rear wall 112 facing away from the bottom wall 111. The rotating shaft 31 is received in the escape opening 10d, and the rack 22 protrudes from the receiving cavity 10a through the escape opening 10d, so as to improve the integration of the rotating shaft 31, the rack 22, and the housing assembly 10 to improve the space utilization.

Referring to FIG. 2, in at least one embodiment, a clamping opening 10e is defined by an edge of each connecting wall 122 facing away from the recess 1221, an edge of the bottom wall 111 connecting the rear wall 112 and the front wall 121, the rear wall 112, and the front wall 121. The cover 13 includes a top wall 131 and two engaging walls 132 connected to opposite sides of the top wall 131 and bent relative to the top wall 131. The sliding member 21 is slidably connected to a side of the top wall 131 facing the receiving cavity 10a and the sliding member 21 is located between the engaging walls 132. Each of the engaging walls 132 is detachably clamped in the clamping opening 10e to facilitate quick disassembly of the cover 13 during maintenance.

In at least one embodiment, the first housing 11 and the second housing 12 are fixed by clamping each other and/or by bolts, so as to improve the connection strength between the first housing 11 and the second housing 12.

It can be understood that, in at least one embodiment, the first housing 11 and the second housing 12 may be integrally formed.

Referring to FIG. 2 and FIG. 3, in at least one embodiment, the cooling hole 10b may include a plurality of first strip-shaped slots 101 arranged at intervals in a first direction X, a plurality of second strip-shaped slots 211 arranged at intervals in the first direction X penetrates the sliding member 21. The sliding member 21 includes a plurality of first regions 212 arranged at intervals in the first direction X, two adjacent first regions 212 are spaced by one of the plurality of second strip-shaped slots 211. The first direction X may be perpendicular to an axis A of the rotating shaft 31. When the sliding member 21 slides relative to the cooling hole 10b, the plurality of second strip-shaped slots 211 can communicate with the plurality of first strip-shaped slots 101 in one to one correspondence, or each of the plurality of first strip-shaped slots 101 can be covered by one of the plurality of first regions 212.

In at least one embodiment, the number of the first strip-shaped slots 101 and the number of the second strip-shaped slots 211 are three respectively. Optionally, the number of the first strip-shaped slots 101 and the number of the second strip-shaped slots 211 may be two, four, five, six, seven, eight, nine, ten, or other quantities more than ten, respectively.

An extending direction of each of the plurality of first strip-shaped slots 101 may be adapted to a shape of a portion of the housing assembly 10 wherein the cooling hole 10b is provided. In the present disclosure, the extending direction of each of the plurality of first strip-shaped slots 101 is adapted to a shape of the top wall 131. In at least one embodiment, two edges of the top wall 131 spaced in the first direction X extends in an arc shape, correspondingly, each of the plurality of first strip-shaped slots 101 extends in an arc shape. Each of the plurality of second strip-shaped slots 211 is shaped like the corresponding first strip-shaped slot 101, so that the plurality of second strip-shaped slots 211 can communicate with the plurality of first strip-shaped slots 101 more easily.

In at least one embodiment, each of the plurality of first strip-shaped slots 101 may extend in a direction perpendicular to the first direction X.

In at least one embodiment, the rack 22 extends outward from the sliding member 21 along the first direction X, and the gear 32 drives the rack 22 to move in the first direction X to drive the sliding member 21 to slide in the first direction X, thereby adjusting the positional relationship between the plurality of first strip-shaped slots 101 and the plurality of second strip-shaped slots 211.

Figure 6:
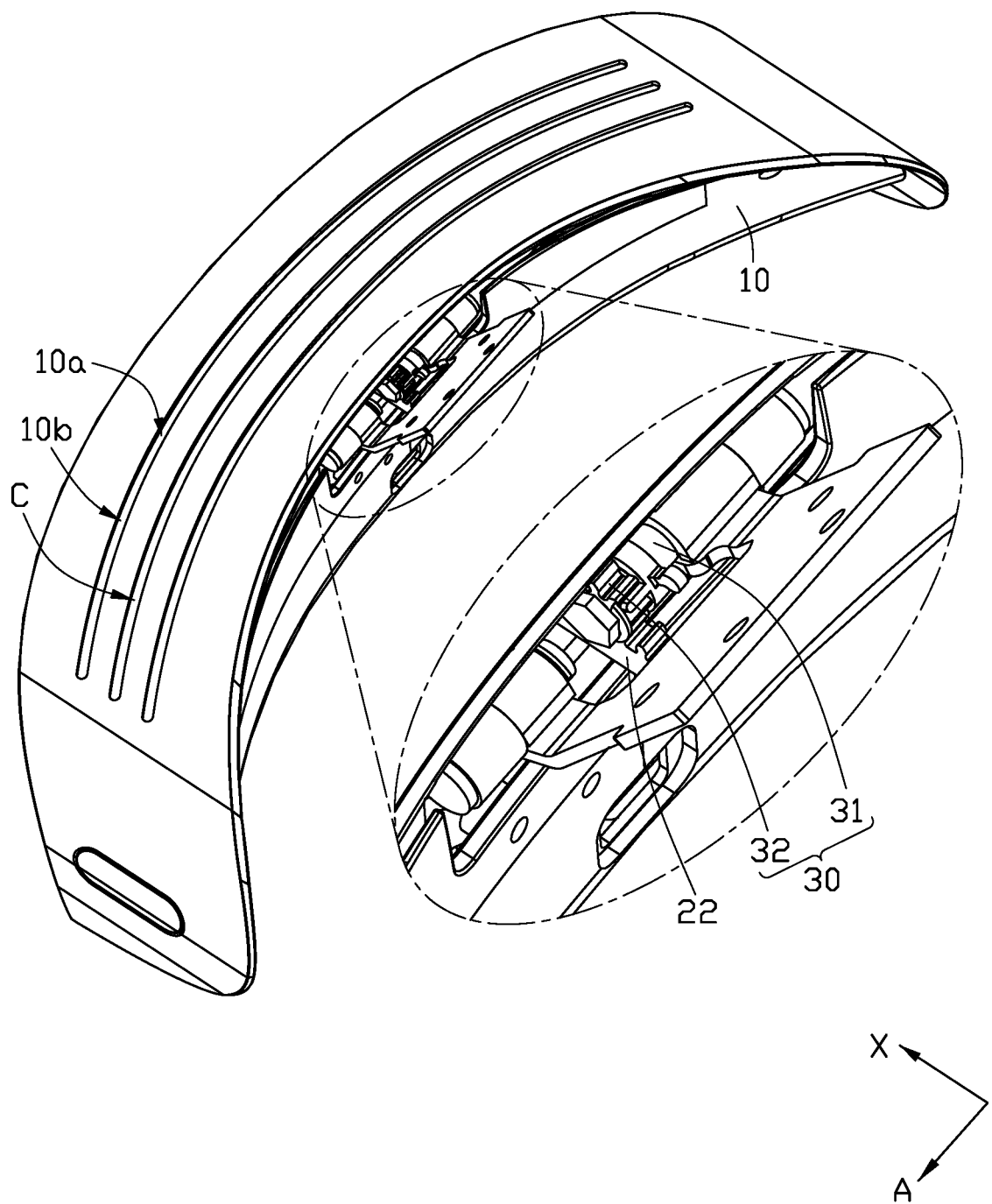
FIG. 6 is a diagram of an embodiment of a heat dissipation device at a second state that a sliding member of the heat dissipation device is located in a second position according to the present disclosure.

Referring to FIG. 1 and FIG. 6, in at least one embodiment, the sliding member 21 can move back and forth between a first position B and a second position C relative to the housing assembly 10. When the sliding member 21 is located at the first position B, the plurality of first strip-shaped slots 101 completely overlaps the plurality of first regions 212, so that the cooling hole 10b is completely closed, and thus the receiving cavity 10a is closed. When the sliding member 21 is located at the second position C, the plurality of first strip-shaped slots 101 completely overlaps the plurality of second strip-shaped slots 211, so that the whole cooling hole 10b communicates with the outside, thereby improving the heat dissipation performance. The sliding member 21 moves from the first position B toward the second position C to reduce an area of the cooling hole 10b blocked by the sliding member 21, and the sliding member 21 moves from the second position C toward the first position B to increase the area the cooling hole 10b blocked by the sliding member 21, so that an area of the cooling hole 10b communicating with the outside can be dynamically adjusted according to the temperature in the receiving cavity 10a.

In at least one embodiment, the plurality of second strip-shaped slots 211 on the sliding member 21 may be omitted, that is, a surface of the sliding member 21 facing the cooling hole 10b is a complete surface. The sliding member 21 slides relative to the cooling hole 10b to block or stay away from the plurality of first strip-shaped slots 101, thereby adjusting the area of the cooling hole 10b communicating with the outside.

In at least one embodiment, the number of the cooling hole 10b may be formed by one first strip-shaped slot 101. Correspondingly, only one second strip-shaped slot 211 is provided on the sliding member 21.

Figure 7:
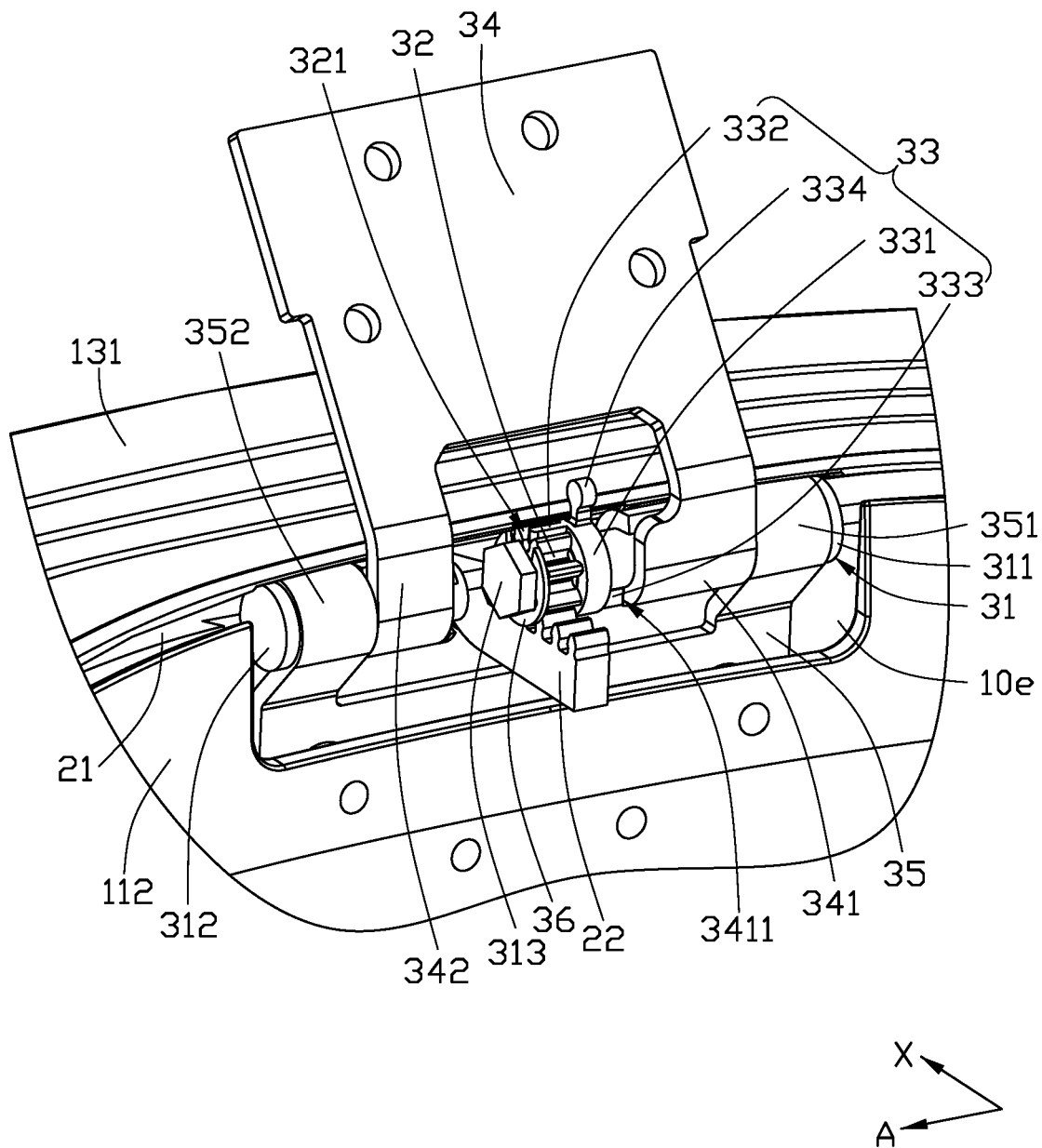
FIG. 7 is a partially enlarged view of the heat dissipation device of FIG. 1.
Figure 8:
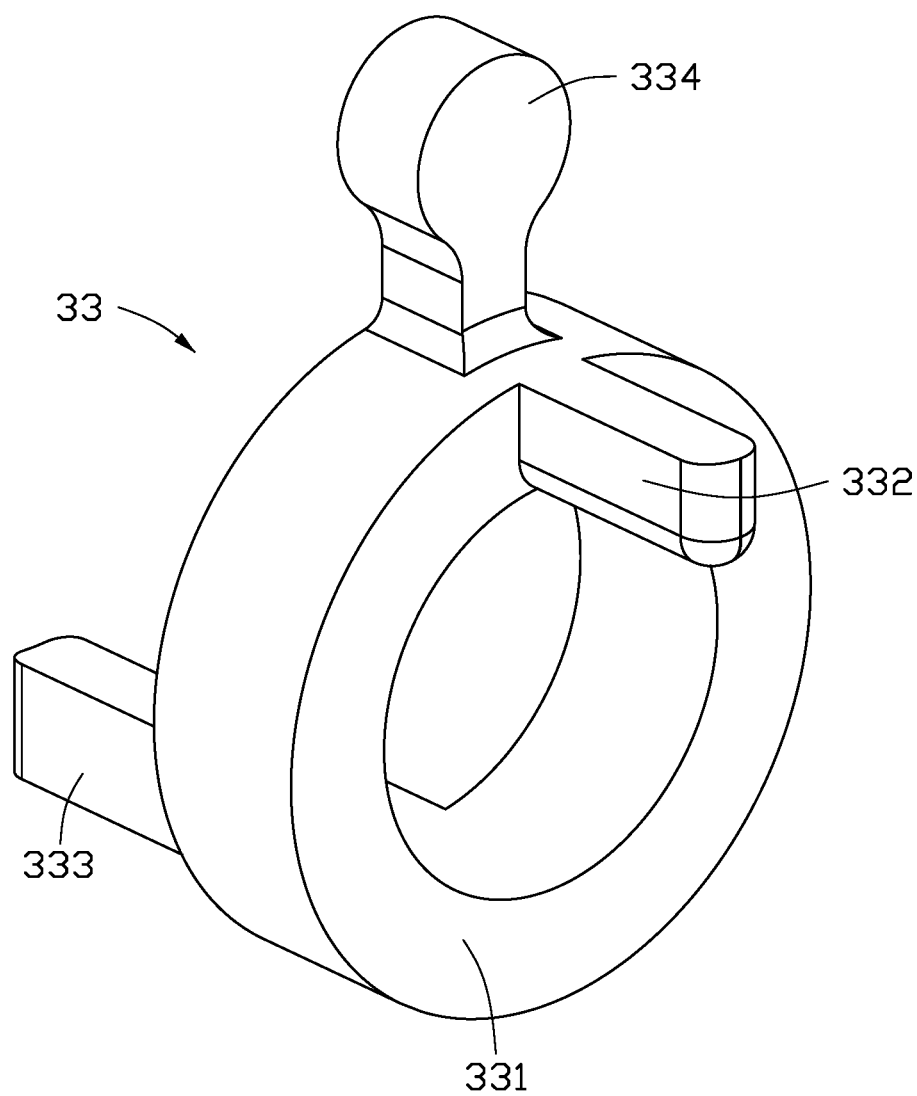
FIG. 8 is a diagram of an embodiment of a linkage member according to the present disclosure.

Referring to FIG. 7 and FIG. 8, in at least one embodiment, the linkage assembly 30 may further include a linkage member 33 and a toggle member 34. The rotating shaft 31 extends through the linkage member 33, and the linkage member 33 is rotatably sleeved on the rotating shaft 31. One end of the toggle member 34 is provided with a first sleeve portion 341, the toggle member 34 extends through the escape opening 10d, and another end of the toggle member 34 is located outside the housing assembly 10. The first sleeve portion 341 is rotatably sleeved on the rotating shaft 31.

Figure 9:
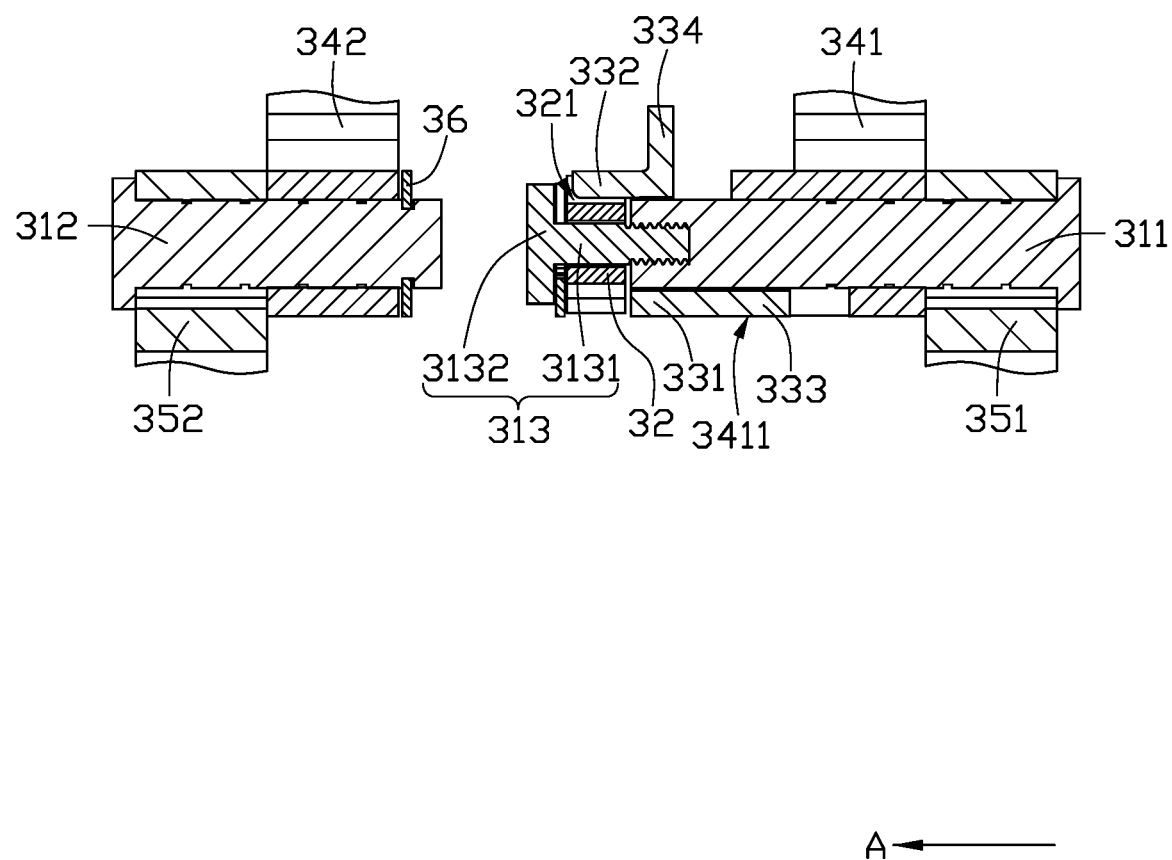
FIG. 9 is a cross-sectional view of the heat dissipation device along F-F line of FIG. 1.

Referring to FIG. 7, FIG. 8, and FIG. 9, the linkage member 33 may include a shaft sleeve portion 331, a first clamping portion 332 and a second clamping portion 333. The first clamping portion 332 and the second clamping portion 333 are respectively connected to opposite sides of the shaft sleeve portion 331. Along a direction of the axis A of the rotating shaft 31, the shaft sleeve portion 331 is slidably arranged between the gear 31 and the first sleeve portion 341. The first clamping portion 332 extends from the shaft sleeve portion 331 toward the gear 32 to selectively enter into a tooth slot 321 of the gear 32 or disengage from the tooth slot 321 of the gear 32. The second clamping portion 333 extends from the shaft sleeve portion 331 toward the first sleeve portion 341, and the second clamping portion 333 is slidably connected to the first sleeve portion 341.

The toggle member 34 is used to control the rotation of the first sleeve portion 341, and the first sleeve portion 341 drives the shaft sleeve portion 331 to rotate through the second clamping portion 333. When the first clamping portion 332 enters into the tooth slot 321 of the gear 32, the shaft sleeve portion 331 is linked with the gear 32 through the first clamping portion 332 to synchronously drive the gear 32 to rotate when the first sleeve portion 341 rotates, and then the sliding member 21 is synchronously driven to slide by the rack 22. When the first clamping portion 332 disengages from the tooth slot 321 of the gear 32, the shaft sleeve portion 331 is out of linkage with the gear 32, and the gear 32 cannot be driven to rotate when the first sleeve portion 341 rotates. Whether the toggle member 34 is linked with the gear 32 can be controlled through the linkage member 33, which reduces the risk of slipping the sliding member 21 by accidentally touching the toggle member 34, so that the adjustment accuracy of the heat dissipation device 100 can be improved.

In at least one embodiment, the first sleeve portion 341 is provided with a first limiting groove 3411, and the first limiting groove 3411 is arranged around the axis A of the rotating shaft 31. An opening of the first limiting groove 3411 faces the shaft sleeve portion 331. The second clamping portion 333 is slidably inserted into the first limiting groove 3411 along the axis A of the rotating shaft 31 to facilitate the shaft sleeve portion 331 to slide between the gear 32 and the first sleeve portion 341.

In at least one embodiment, the linkage member 33 may further include a control portion 334. One end of the control portion 334 is connected to an outer peripheral surface of the shaft sleeve portion 331, and another end of the control portion 334 extends to the outside of the housing assembly 10 along a radial direction of the rotating shaft 31 perpendicular to the axis A of the rotating shaft 31 to be used to drive the shaft sleeve portion 331 to slide between the gear 32 and the first sleeve portion 341. Specifically, the control portion 334 may extend through the escape opening 10d and a part of the control portion 334 is located outside the housing assembly 10. In at least one embodiment, the control portion 334 may be against the top wall 131 to limit a rotatable angle of the shaft sleeve portion 331.

In at least one embodiment, the rotating shaft 31 may include a first shaft portion 311 and a second shaft portion 312 arranged coaxially and at intervals. One end of the toggle member 34 may be further provided with a second sleeve portion 342 spaced apart from the first sleeve portion 341. The gear 32, the linkage member 33 and the first sleeve portion 341 are sleeved on the first shaft portion 311, and the second sleeve portion 342 is sleeved on the second shaft portion 312. The convenience of assembly is improved by the first shaft portion 311 and the second shaft portion 312 arranged separately.

In at least one embodiment, the rotating shaft 31 may further include a bolt 313 connected to the first shaft portion 311. The bolt 313 includes a screw rod 3131 and a nut 3132 connected in sequence. The screw rod 3131 and the first shaft portion 311 are arranged coaxially, and an end of the screw rod 3131 is fixed in the first shaft portion 311. The nut 3132 is spaced apart from the first shaft portion 311. The gear 32 is rotatably sleeved on the screw rod 3131 and the gear 32 is located between the nut 3132 and the first shaft portion 311, so that the sliding of the gear 32 along the axis A of the rotating shaft 31 is limited, the stability of the gear 32 in operation is improved. Moreover, an outer diameter of the screw rod 3131 is less than an outer diameter of the rotating shaft 31, which is beneficial to reduce the volume of the gear 32 and improve space utilization.

Optionally, the screw rod 3131 may be fixedly connected to an end of the first shaft portion 311 through threads, so as to realize quick disassembly and maintenance.

Referring to FIG. 7 and FIG. 9, in at least one embodiment, the linkage assembly 30 may further include a fixing member 35. One end of the fixing member 35 is fixedly connected to the housing assembly 10, and another end of the fixing member 35 is provided with a third sleeve portion 351 and a fourth sleeve portion 352 arranged at intervals. Specifically, the fixing member 35 is fixedly connected to the rear wall 112, the third sleeve portion 351 and the fourth sleeve portion 352 are located in the escape opening 10d.

The third sleeve portion 351 is sleeved on the first shaft portion 311 and the third sleeve portion 351 is located a side of the first sleeve portion 341 away from the linkage member 33. The fourth sleeve portion 352 is sleeved on the second shaft portion 312 and the fourth sleeve portion 352 is arranged adjacent to the second sleeve portion 342. The first shaft portion 311 and the second shaft portion 312 are respectively supported by the third sleeve portion 351 and fourth sleeve portion 352 to improve the connection strength between the rotating shaft 31 and the housing assembly 10.

In at least one embodiment, the linkage assembly 30 may further include two gaskets 36. One of the gaskets 36 is arranged between the gear 32 and the nut 3132 to improve the stability of the rotation of the gear 32. Another of the gaskets 36 is arranged on an end of the second shaft portion 312 to improve the stability of the second sleeve portion 342.

In at least one embodiment, the rotating shaft 31 may have an integral structure, and the gear 32, the linkage member 33, the toggle member 34, and the fixing member 35 may be all sleeved on the rotating shaft 31.

In at least one embodiment, the heat dissipation device 100 may further include a sensor (not shown). The sensor is received in the receiving cavity 10a for sensing the temperature in the receiving cavity 10a. When the temperature in the receiving cavity 10a reaches a preset value, the user is prompted by light or sound to adjust the sliding member 31 via the linkage assembly 30.

In at least one embodiment, the gear 32 may be directly driven by a motor or a cylinder, and the motor or the cylinder is electrically connected to the sensor to realize the automatic adjustment function.

Figure 10:
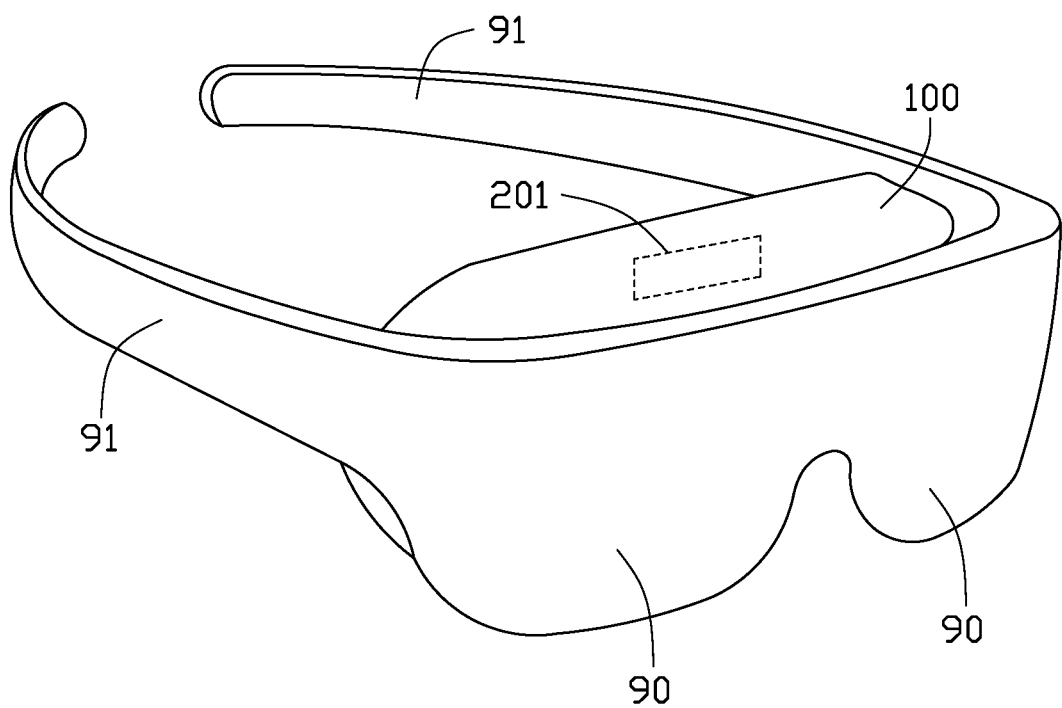
FIG. 10 is a diagram of an embodiment of a display equipment according to the present disclosure.

FIG. 10 illustrates an embodiment of a display equipment 200. The display equipment 200 includes at least one electronic component 201, a lens assembly 90, and the above heat dissipation device 100. Referring to FIG. 10 and FIG. 3, the at least one electronic component 201 is received in the receiving cavity 10a, the lens assembly 90 is connected to the housing assembly 10 and the lens assembly 90 is electrically connected to the at least one electronic component 201 for displaying images. The images may be but not limited to AR images or VR images.

In at least one embodiment, the lens assembly 90 is connected to the bottom wall 111.

In at least one embodiment, the display equipment 200 may further include a wearing assembly 91 connected to the housing assembly 10 for wearing the display equipment 200 on the human body. The wearing assembly 91 may be but not limited to a glasses holder, a strap, or a helmet.

In the above heat dissipation device 100 and the above display equipment 200, the area of the cooling hole 10b blocked by the sliding member 21 can be adjusted by sliding the sliding member 21 relative to the cooling hole 10b. The precision of the sliding member 21 sliding relative to the cooling hole 10b can be improved through the linkage of the gear 32 and the rack 22, so that the area of the cooling hole 10b blocked by the sliding member 21 can be adjusted accurately, and the heat dissipation efficiency can be improved because the area of the cooling hole 10b communicating with the external environment can be dynamically adjusted according to the temperature inside the cooling hole 10b.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A heat dissipation device comprising:
a housing assembly comprising a receiving cavity and a cooling hole communicating with the receiving cavity;
a sliding assembly comprising a sliding member and a rack, wherein the sliding member is located in the receiving cavity and the sliding member is slidably connected to a side of the housing assembly with the cooling hole, the rack is fixedly connected to the sliding member; and
a linkage assembly comprising a rotating shaft and a gear, wherein the rotating shaft and the gear are located on the same side of the sliding member, the rotating shaft is fixed on the housing assembly and extends through the gear, the gear is rotatably sleeved on the rotating shaft and is engaged with the rack, the gear is configured to drive the sliding member to slide relative to the cooling hole through the rack, thereby adjusting an area of the cooling hole blocked by the sliding member.

2. The heat dissipation device of claim 1, wherein the linkage assembly further comprises a linkage member and a toggle member, the rotating shaft extends through the linkage member, the linkage member is rotatably sleeved on the rotating shaft, one end of the toggle member is provided with a first sleeve portion, the toggle member extends through the housing assembly and another end of the toggle member is located outside the housing assembly, the first sleeve portion is rotatably sleeved on the rotating shaft; the linkage member comprises a shaft sleeve portion, a first clamping portion, and a second clamping portion, the first clamping portion and the second clamping portion are respectively connected to opposite sides of the shaft sleeve portion, along a direction of an axis of the rotating shaft, the shaft sleeve portion is slidably arranged between the gear and the first sleeve portion; the first clamping portion extends from the shaft sleeve portion toward the gear to selectively enter into a tooth slot of the gear or disengage from the tooth slot of the gear, the second clamping portion extends from the shaft sleeve portion toward the first sleeve portion, and the second clamping portion is slidably connected to the first sleeve portion.

3. The heat dissipation device of claim 2, wherein the first sleeve portion is provided with a first limiting groove, the first limiting groove is arranged around the axis of the rotating shaft, an opening of the first limiting groove faces the shaft sleeve portion, the second clamping portion is slidably inserted into the first limiting groove along the axis of the rotating shaft.

4. The heat dissipation device of claim 2, wherein the linkage assembly further comprises a control portion, one end of the control portion is connected to an outer peripheral surface of the shaft sleeve portion facing away from the rotating shaft, and another end of the control portion extends to outside of the housing assembly along a radial direction of the rotating shaft perpendicular to the axis of the rotating shaft, the control portion is configured to drive the shaft sleeve portion to slide between the gear and the first sleeve portion.

5. The heat dissipation device of claim 2, wherein the rotating shaft comprises a first shaft portion and a second shaft portion arranged coaxially and at intervals, an end of the toggle member is further provided with a second sleeve portion spaced apart from the first sleeve portion; the gear, the linkage member, and the first sleeve portion are sleeved on the first shaft portion, and the second sleeve portion is sleeved on the second shaft portion.

6. The heat dissipation device of claim 5, wherein the rotating shaft further comprises a bolt connected to the first shaft portion, the bolt comprises a screw rod and a nut connected to the screw rod, the screw rod and the first shaft portion are arranged coaxially, and an end of the screw rod is fixed in the first shaft portion, the nut is spaced apart from the first shaft portion, the gear is rotatably sleeved on the screw rod, and the gear is located between the nut and the first shaft portion.

7. The heat dissipation device of claim 5, wherein the linkage assembly further comprises a fixing member, one end of the fixing member is fixedly connected to the housing assembly, and another end of the fixing member is provided with a third sleeve portion and a fourth sleeve portion arranged at intervals; the third sleeve portion is sleeved on the first shaft portion, the third sleeve portion is located at a side of the first sleeve portion away from the linkage member, the fourth sleeve portion is sleeved on the second shaft portion, and the fourth sleeve portion is arranged adjacent to the second sleeve portion.

8. The heat dissipation device of claim 1, wherein the cooling hole comprises a plurality of first strip-shaped slots arranged at intervals in a first direction, a plurality of second strip-shaped slots arranged at intervals in the first direction penetrates the sliding member, the sliding member comprises a plurality of first regions arranged at intervals in the first direction, two adjacent first regions of the plurality of first regions are spaced by one of the plurality of second strip-shaped slots; the first direction is perpendicular to an axis of the rotating shaft, the sliding member slides relative to the cooling hole to communicate with the plurality of second strip-shaped slots and the plurality of first strip-shaped slots in one to one correspondence or block the plurality of first strip-shaped slots through the plurality of first regions.

9. The heat dissipation device of claim 8, wherein the sliding member moves back and forth between a first position and a second position relative to the housing assembly in the first direction, when the sliding member is located at the first position, the plurality of first strip-shaped slots completely overlaps the plurality of first regions, when the sliding member is located at the second position, the plurality of first strip-shaped slots completely overlaps the plurality of second strip-shaped slots, an area of the cooling hole blocked by the sliding member is reduced when the sliding member moves from the first position toward the second position, the area of the cooling hole blocked by the sliding member is increased when the sliding member moves from the second position toward the first position.

10. The heat dissipation device of claim 1, wherein the housing assembly comprises a first housing, a second housing, and a cover, the first housing and the second housing are connected to each other to define the receiving cavity and an opening on one side of the receiving cavity, the cover covers the opening, the cooling hole is defined by the cover, the sliding member is slidably connected to a side of the cover facing the receiving cavity.

11. The heat dissipation device of claim 10, wherein the first housing comprises a bottom wall and a rear wall bent relative to the bottom wall, the second housing comprises a front wall and two connecting walls connected to one side of the front wall, the connecting walls are arranged at intervals, a side of the bottom wall facing away from the rear wall is connected to a side of the front wall facing away from the connecting walls, a side of the connecting walls facing away from the front wall is connected to a side of the rear wall facing away from the bottom wall, the opening is defined by the front wall, the connecting walls, and the rear wall; sides of the connecting walls facing each other are respectively provided with recesses, and opposite sides of the sliding member are slidably connected in the recesses; an escape opening is defined on the side of the rear wall facing away from the bottom wall, the rotating shaft is received in the escape opening, and the rack protrudes from the receiving cavity through the escape opening.

12. The heat dissipation device of claim 11, wherein a clamping opening is defined by an edge of each connecting wall facing away from the recess, an edge of the bottom wall connecting the rear wall and the front wall, the rear wall, and the front wall; the cover comprises a top wall and two engaging walls connected to opposite sides of the top wall and bent relative to the top wall; the sliding member is slidably connected to a side of the top wall facing the receiving cavity and the sliding member is located between the engaging walls, each of the engaging walls is detachably clamped in the clamping opening.

13. A display equipment comprising:
  at least one electronic component;
  a lens assembly; and
  a heat dissipation device comprising:
    a housing assembly comprising a receiving cavity and a cooling hole communicating with the receiving cavity;
    a sliding assembly comprising a sliding member and a rack, wherein the sliding member is located in the receiving cavity and the sliding member is slidably connected to a side of the housing assembly with the cooling hole, the rack is fixedly connected to the sliding member; and
    a linkage assembly comprising a rotating shaft and a gear, wherein the rotating shaft and the gear are located on the same side of the sliding member, the rotating shaft is fixed on the housing assembly and extends through the gear, the gear is rotatably sleeved on the rotating shaft and is engaged with the rack, the gear is configured to drive the sliding member to slide relative to the cooling hole through the rack, thereby adjusting an area of the cooling hole blocked by the sliding member;
  wherein the at least one electronic component is received in the receiving cavity, the lens assembly is connected to the housing assembly and the lens assembly is electrically connected to the at least one electronic component for displaying images.

14. The display equipment of claim 13, wherein the linkage assembly further comprises a linkage member and a toggle member, the rotating shaft extends through the linkage member, the linkage member is rotatably sleeved on the rotating shaft, one end of the toggle member is provided with a first sleeve portion, the toggle member extends through the housing assembly and another end of the toggle member is located outside the housing assembly, the first sleeve portion is rotatably sleeved on the rotating shaft; the linkage member comprises a shaft sleeve portion, a first clamping portion, and a second clamping portion, the first clamping portion and the second clamping portion are respectively connected to opposite sides of the shaft sleeve portion, along a direction of an axis of the rotating shaft, the shaft sleeve portion is slidably arranged between the gear and the first sleeve portion; the first clamping portion extends from the shaft sleeve portion toward the gear to selectively enter into a tooth slot of the gear or disengage from the tooth slot of the gear, the second clamping portion extends from the shaft sleeve portion toward the first sleeve portion, and the second clamping portion is slidably connected to the first sleeve portion.

15. The display equipment of claim 14, wherein the first sleeve portion is provided with a first limiting groove, the first limiting groove is arranged around the axis of the rotating shaft, an opening of the first limiting groove faces the shaft sleeve portion, the second clamping portion is slidably inserted into the first limiting groove along the axis of the rotating shaft.

16. The display equipment of claim 14, wherein the linkage assembly further comprises a control portion, one end of the control portion is connected to an outer peripheral surface of the shaft sleeve portion facing away from the rotating shaft, and another end of the control portion extends to the outside of the housing assembly along a radial direction of the rotating shaft perpendicular to the axis of the rotating shaft, the control portion is configured to drive the shaft sleeve portion to slide between the gear and the first sleeve portion.

17. The display equipment of claim 14, wherein the rotating shaft comprises a first shaft portion and a second shaft portion arranged coaxially and at intervals, an end of the toggle member is further provided with a second sleeve portion spaced apart from the first sleeve portion; the gear, the linkage member, and the first sleeve portion are sleeved on the first shaft portion, and the second sleeve portion is sleeved on the second shaft portion.

18. The display equipment of claim 17, wherein the rotating shaft further comprises a bolt connected to the first shaft portion, the bolt comprises a screw rod and a nut connected to the screw rod, the screw rod and the first shaft portion are arranged coaxially, and an end of the screw rod is fixed in the first shaft portion, the nut is spaced apart from the first shaft portion, the gear is rotatably sleeved on the screw rod, and the gear is located between the nut and the first shaft portion.

19. The display equipment of claim 17, wherein the linkage assembly further comprises a fixing member, one end of the fixing member is fixedly connected to the housing assembly, and another end of the fixing member is provided with a third sleeve portion and a fourth sleeve portion arranged at intervals; the third sleeve portion is sleeved on the first shaft portion, the third sleeve portion is located at a side of the first sleeve portion away from the linkage member, the fourth sleeve portion is sleeved on the second shaft portion, and the fourth sleeve portion is arranged adjacent to the second sleeve portion.

20. The display equipment of claim 13, wherein the cooling hole comprises a plurality of first strip-shaped slots arranged at intervals in a first direction, a plurality of second strip-shaped slots arranged at intervals in the first direction penetrates the sliding member, the sliding member comprises a plurality of first regions arranged at intervals in the first direction, two adjacent first regions of the plurality of first regions are spaced by one of the plurality of second strip-shaped slots; the first direction is perpendicular to an axis of the rotating shaft, the sliding member slides relative to the cooling hole to communicate with the plurality of second strip-shaped slots and the plurality of first strip-shaped slots in one to one correspondence or block the plurality of first strip-shaped slots through the plurality of first regions.

* * * * *